(12) United States Patent
Buijs et al.

(10) Patent No.: US 12,710,699 B2
(45) Date of Patent: Aug. 18, 2026

(54) METHODS OF MITIGATING CROSSTALK IN METROLOGY IMAGES

(71) Applicant: ASML Netherlands B.V., Veldhoven (NL)

(72) Inventors: Robin Daniel Buijs, Eindhoven (NL); Willem Marie Julia Marcel Coene, Mierlo (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 18/869,301

(22) PCT Filed: Jun. 16, 2023

(86) PCT No.: PCT/EP2023/066210
§ 371 (c)(1),
(2) Date: Nov. 26, 2024

(87) PCT Pub. No.: WO2024/022673
PCT Pub. Date: Feb. 1, 2024

(65) Prior Publication Data

US 2025/0355370 A1 Nov. 20, 2025

(30) Foreign Application Priority Data

Jul. 29, 2022 (EP) .................................... 22187892

(51) Int. Cl.
*G03F 7/00* (2006.01)
*G06T 5/50* (2006.01)
*G06T 7/00* (2017.01)

(52) U.S. Cl.
CPC .... *G03F 7/706839* (2023.05); *G03F 7/70633* (2013.01); *G03F 7/70641* (2013.01);
(Continued)

(58) Field of Classification Search
CPC .......... G03F 7/706839; G03F 7/70633; G03F 7/70641; G03F 7/706837; G03F 7/706847;
(Continued)

(56) References Cited

U.S. PATENT DOCUMENTS 6,952,253 B2 10/2005 Lof et al.
7,701,577 B2 4/2010 Straaijer et al.
(Continued)

FOREIGN PATENT DOCUMENTS

EP 1 628 164 A2 2/2006
EP 3 611 567 A2 2/2020
(Continued)

OTHER PUBLICATIONS

International Search Report and Written Opinion of the International Searching Authority directed to International Patent Application No. PCT/EP2023/066210, mailed Sep. 6, 2023; 11 pages.
(Continued)

*Primary Examiner* — Seung C Sohn
(74) *Attorney, Agent, or Firm* — FINNEGAN, HENDERSON, FARABOW, GARRETT & DUNNER, LLP

(57) ABSTRACT

Disclosed is a method of determining an orthonormalized structure of interest reference image, the orthonormalized structure of interest reference image for applying to a measured image of the structure of interest to correct for the effect of crosstalk from at least one nuisance structure. The method comprises determining a structure of interest reference image based on knowledge of the structure of interest; determining at least one nuisance structure reference image based on knowledge of the at least one nuisance structure; and orthonormalizing the structure of interest reference
(Continued)

image to the at least one nuisance reference image to obtain the orthonormalized structure of interest reference image.

15 Claims, 5 Drawing Sheets

(52) U.S. Cl.
CPC .. *G03F 7/706837* (2023.05); *G03F 7/706847* (2023.05); *G03F 7/706851* (2023.05); *G06T 5/50* (2013.01); *G06T 7/001* (2013.01); *G06T 2207/30148* (2013.01)

(58) Field of Classification Search
CPC ..... G03F 7/706851; G06T 5/50; G06T 7/001; G06T 2207/30148
See application file for complete search history.

(56) References Cited

U.S. PATENT DOCUMENTS

| | | | |
|---|---|---|---|
| 7,791,724 | B2 | 9/2010 | Den Boef et al. |
| 8,115,926 | B2 | 2/2012 | Straaijer |
| 8,553,227 | B2 | 10/2013 | Jordanoska |
| 8,681,312 | B2 | 3/2014 | Straaijer |
| 8,692,994 | B2 | 4/2014 | Straaijer |
| 8,792,096 | B2 | 7/2014 | Straaijer |
| 8,797,554 | B2 | 8/2014 | Straaijer |
| 8,823,922 | B2 | 9/2014 | Den Boef |
| 10,831,109 | B2 * | 11/2020 | Jak ...................... G03F 7/70633 |
| 2010/0328655 | A1 | 12/2010 | Den Boef |
| 2011/0026032 | A1 | 2/2011 | Den Boef et al. |
| 2011/0102753 | A1 | 5/2011 | Van De Kerkhof et al. |
| 2011/0249244 | A1 | 10/2011 | Leewis et al. |
| 2012/0044470 | A1 | 2/2012 | Smilde et al. |
| 2013/0162996 | A1 | 6/2013 | Straaijer et al. |
| 2016/0161863 | A1 | 6/2016 | Den Boef et al. |
| 2016/0370717 | A1 | 12/2016 | Den Boef et al. |
| 2017/0090302 | A1 * | 3/2017 | Slotboom ........... G03F 7/70641 |
| 2019/0355110 | A1 | 11/2019 | Cohen |

FOREIGN PATENT DOCUMENTS

| | | | |
|---|---|---|---|
| EP | 3 796 089 | A1 | 3/2021 |
| WO | WO 2009/138162 | A1 | 11/2009 |
| WO | WO 2011/012624 | A1 | 2/2011 |
| WO | WO 2015/009739 | A1 | 1/2015 |
| WO | WO 2015/113724 | A1 | 8/2015 |

OTHER PUBLICATIONS

Quicke et al., "high speed functional imaging with source localized multifocal two-photon microscopy," Biomedical Optics Express, vol. 9, No. 8, Jul. 12, 2018; pp. 3678-3693.

* cited by examiner

19
PU
13N
13S
0(N)
0(S)
18
21
DF
23
17
O
N
S
20
22
11
12
13
14
15
0(S)
0(N)
16
+1(N)
-1(S)
W

0
+1
O
I
-1
W
T 13E
13W

13NW
13SE

W
31
32
35
33
34

41
42
45
P1
P2
ROI
P3
P4
43
44
40

METHODS OF MITIGATING CROSSTALK IN METROLOGY IMAGES

CROSS REFERENCE TO RELATED APPLICATIONS

This application claims priority of EP application 22187892.9 which was filed on 2022 Jul. 29 and which is incorporated herein in its entirety by reference.

FIELD

The present invention relates to a metrology method and device which may, for example, be used for determining a characteristic of structures on a substrate.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD=k_1\times\lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low k1.

In lithographic processes, it is desirable to make frequently measurements of the structures created, e.g., for process control and verification. Various tools for making such measurements are known, including scanning electron microscopes or various forms of metrology apparatuses, such as scatterometers. A general term to refer to such tools may be metrology apparatuses or inspection apparatuses.

In a known metrology technique, overlay measurement results are obtained by measuring an overlay target twice under certain conditions, while either rotating the overlay target or changing the illumination mode or imaging mode to obtain separately the $-1^{st}$ and the $+1^{st}$ diffraction order intensities (or diffraction efficiencies, the parameters are related). The intensity asymmetry (or diffraction efficiency asymmetry), a comparison of these diffraction order intensities, for a given overlay target provides a measurement of target asymmetry, that is asymmetry in the target. This asymmetry in the overlay target can be used as an indicator of overlay (undesired misalignment of two layers).

Measurement of a parameter of interest such as overlay is often based on acquiring measurement images of a target, where the imaged target is subject to crosstalk from neighboring structures. This crosstalk impacts the inferred parameter of interest value.

It would be desirable to mitigate for this crosstalk.

SUMMARY

Embodiments of the invention are disclosed in the claims and in the detailed description.

In a first aspect of the invention there is provided a method of determining an orthonormalized structure of interest reference image, the orthonormalized structure of interest reference image for applying to a measured image of the structure of interest to correct for the effect of crosstalk from at least one nuisance structure; the method comprising: determining a structure of interest reference image based on knowledge of the structure of interest; determining at least one nuisance structure reference image based on knowledge of at least one nuisance structure; and orthonormalizing the structure of interest reference image to at least one nuisance reference image to obtain the orthonormalized structure of interest reference image.

According to a second aspect of the present invention there is provided a method of determining a measurement parameter relating to a structure of interest, the method comprising: obtaining an orthonormalized structure of interest reference image relating to said structure of interest, the orthonormalized structure of interest reference image having been orthonormalized with respect to at least one nuisance structure reference image relating to at least one nuisance structure; obtaining at least one measured image comprising an image of the structure of interest which is impacted by the nuisance structure; and determining the measurement parameter from a combination of each said at least one measured image and the orthonormalized structure of interest reference image such that the determined measurement parameter is corrected for the impact of the nuisance structure.

According to a third aspect of the present invention there is provided a computer program comprising program instructions operable to perform the method of the first aspect, when run on a suitable apparatus.

The invention yet further provides a processing arrangement and metrology device comprising the computer program of the second aspect.

These and other aspects and advantages of the apparatus and methods disclosed herein will be appreciated from a consideration of the following description and drawings of exemplary embodiments.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figures 1, 2:
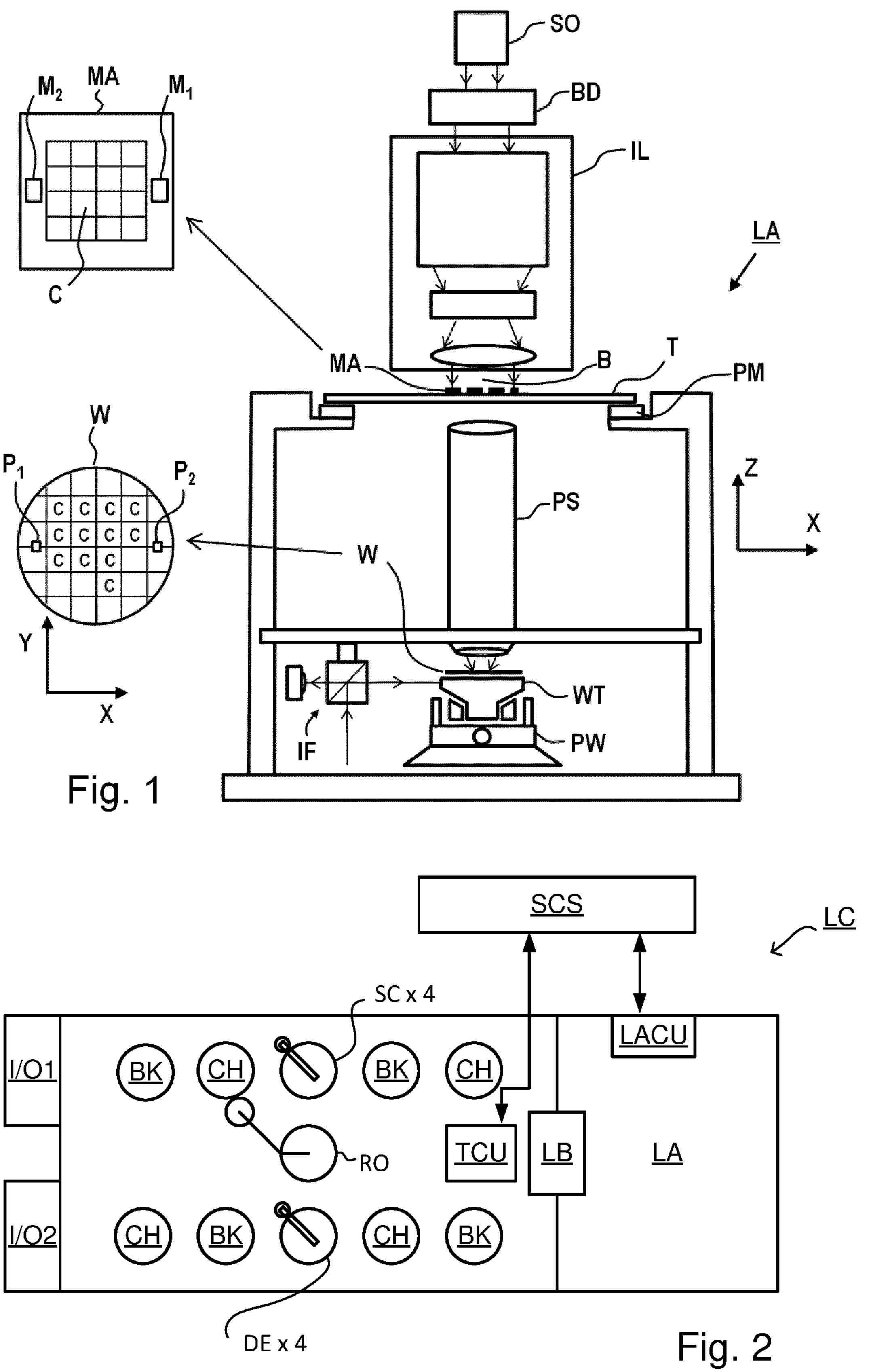
FIG. 1 depicts a schematic overview of a lithographic apparatus.
FIG. 2 depicts a schematic overview of a lithographic cell.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figures 3, 4:
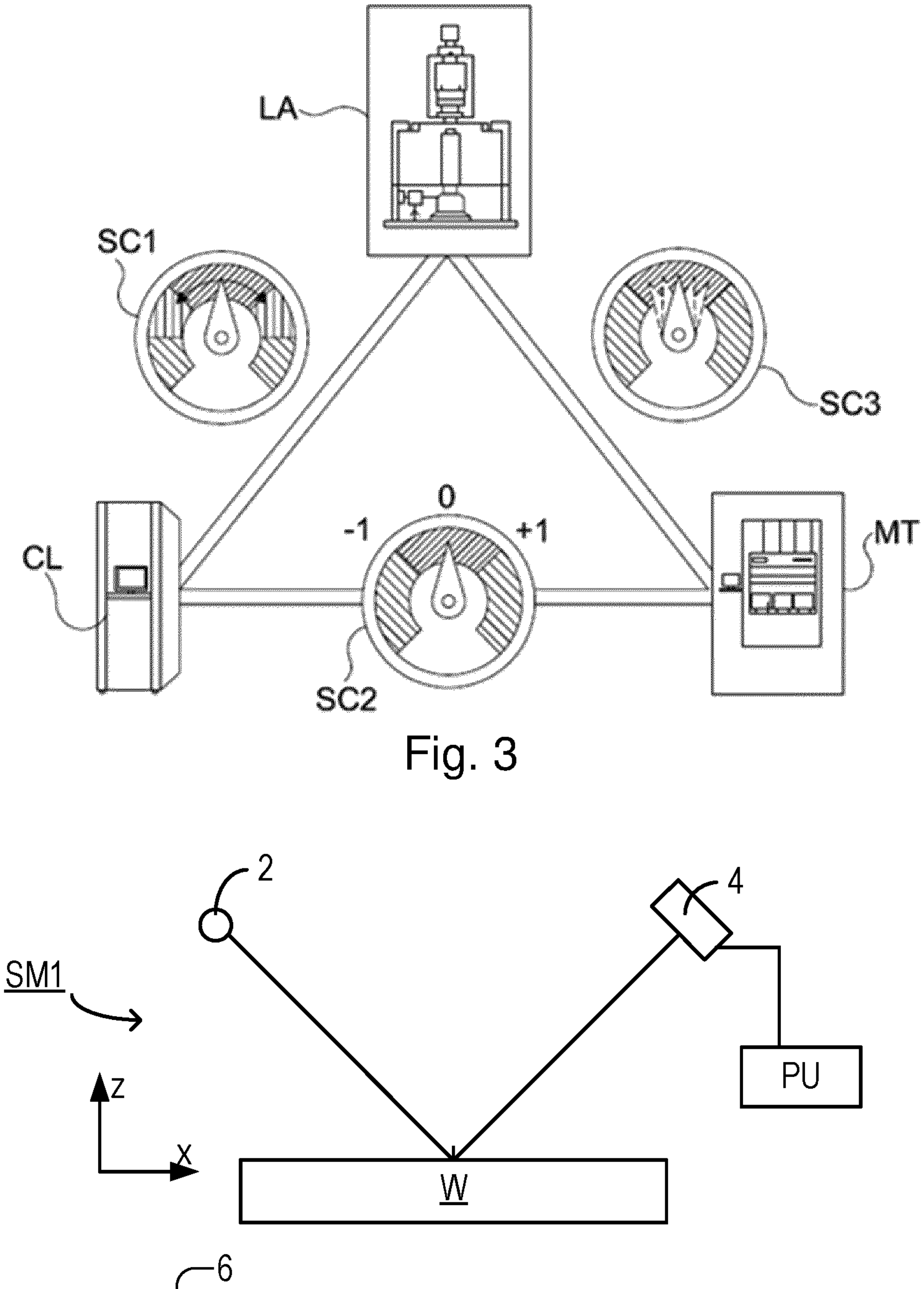
FIG. 3 depicts a schematic representation of holistic lithography, representing a cooperation between three key technologies to optimize semiconductor manufacturing.
FIG. 4 is a schematic illustration of a scatterometry apparatus.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MET (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device) —typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MET) to predict whether defects may be present due to e.g. sub-optimal processing (depicted in FIG. 3 by the arrow pointing "0" in the second scale SC2).

The metrology tool MET may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

In lithographic processes, it is desirable to make frequently measurements of the structures created, e.g., for process control and verification. Various tools for making such measurements are known, including scanning electron microscopes or various forms of metrology apparatuses, such as scatterometers. Examples of known scatterometers often rely on provision of dedicated metrology targets, such as underfilled targets (a target, in the form of a simple grating or overlapping gratings in different layers, that is large enough that a measurement beam generates a spot that is smaller than the grating) or overfilled targets (whereby the illumination spot partially or completely contains the target). Further, the use of metrology tools, for example an angular resolved scatterometer illuminating an underfilled target, such as a grating, allows the use of so-called reconstruction methods where the properties of the grating can be calculated by simulating interaction of scattered radiation with a mathematical model of the target structure and comparing the simulation results with those of a measurement. Parameters of the model are adjusted until the simulated interaction produces a diffraction pattern similar to that observed from the real target.

Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in the image plane or a plane conjugate with the image plane, in which case the measurements are usually referred as image or field based measurements. Such scatterometers and the associated measurement techniques are further described in patent applications US20100328655, US2011102753A1, US20120044470A, US20110249244, US20110026032 or EP1628164A, incorporated herein by reference in their entirety. Aforementioned scatterometers can measure in one image multiple targets from multiple gratings using light from soft x-ray and visible to near-IR wave range.

A metrology apparatus, such as a scatterometer, is depicted in FIG. 4. It comprises a broadband (white light) radiation projector 2 which projects radiation 5 onto a substrate W. The reflected or scattered radiation 10 is passed to a spectrometer detector 4, which measures a spectrum 6 (i.e. a measurement of intensity I as a function of wavelength λ) of the specular reflected radiation 10. From this data, the structure or profile 8 giving rise to the detected spectrum may be reconstructed by processing unit PU, e.g. by Rigorous Coupled Wave Analysis and non-linear regression or by comparison with a library of simulated spectra. In general, for the reconstruction, the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

In a first embodiment, the scatterometer MT is an angular resolved scatterometer. In such a scatterometer reconstruction methods may be applied to the measured signal to reconstruct or calculate properties of the grating. Such reconstruction may, for example, result from simulating interaction of scattered radiation with a mathematical model of the target structure and comparing the simulation results with those of a measurement. Parameters of the mathematical model are adjusted until the simulated interaction produces a diffraction pattern similar to that observed from the real target.

In a second embodiment, the scatterometer MT is a spectroscopic scatterometer MT. In such spectroscopic scatterometer MT, the radiation emitted by a radiation source is directed onto the target and the reflected or scattered radiation from the target is directed to a spectrometer detector, which measures a spectrum (i.e. a measurement of intensity as a function of wavelength) of the specular reflected radiation. From this data, the structure or profile of the target giving rise to the detected spectrum may be reconstructed, e.g. by Rigorous Coupled Wave Analysis and non-linear regression or by comparison with a library of simulated spectra.

In a third embodiment, the scatterometer MT is an ellipsometric scatterometer. The ellipsometric scatterometer allows for determining parameters of a lithographic process by measuring scattered radiation for each polarization states. Such metrology apparatus emits polarized light (such as linear, circular, or elliptic) by using, for example, appropriate polarization filters in the illumination section of the metrology apparatus. A source suitable for the metrology apparatus may provide polarized radiation as well. Various embodiments of existing ellipsometric scatterometers are described in U.S. patent application Ser. Nos. 11/451,599, 11/708,678, 12/256,780, 12/486,449, 12/920,968, 12/922,587, 13/000,229, 13/033,135, 13/533,110 and 13/891,410 incorporated herein by reference in their entirety.

In one embodiment of the scatterometer MT, the scatterometer MT is adapted to measure the overlay of two misaligned gratings or periodic structures by measuring asymmetry in the reflected spectrum and/or the detection configuration, the asymmetry being related to the extent of the overlay.

The two (typically overlapping) grating structures may be applied in two different layers (not necessarily consecutive layers), and may be formed substantially at the same position on the wafer. The scatterometer may have a symmetrical detection configuration as described e.g. in co-owned patent application EP1628164A, such that any asymmetry is clearly distinguishable. This provides a straightforward way to measure misalignment in gratings. Further examples for measuring overlay error between the two layers containing periodic structures as target is measured through asymmetry of the periodic structures may be found in PCT patent application publication no. WO 2011/012624 or US patent application US20160161863, incorporated herein by reference in its entirety. Other parameters of interest may be focus and dose. Focus and dose may be determined simultaneously by scatterometry (or alternatively by scanning electron microscopy) as described in US patent application US2011-0249244, incorporated herein by reference in its entirety.

The targets may be measured in an underfilled mode or in an overfilled mode. In the underfilled mode, the measurement beam generates a spot that is smaller than the overall target. In the overfilled mode, the measurement beam generates a spot that is larger than the overall target. In such overfilled mode, it may also be possible to measure different targets simultaneously, thus determining different processing parameters at the same time.

Overall measurement quality of a lithographic parameter using a specific target is at least partially determined by the measurement recipe used to measure this lithographic parameter. The term "substrate measurement recipe" may include one or more parameters of the measurement itself, one or more parameters of the one or more patterns measured, or both. For example, if the measurement used in a substrate measurement recipe is a diffraction-based optical measurement, one or more of the parameters of the measurement may include the wavelength of the radiation, the polarization of the radiation, the incident angle of radiation relative to the substrate, the orientation of radiation relative to a pattern on the substrate, etc. One of the criteria to select a measurement recipe may, for example, be a sensitivity of one of the measurement parameters to processing variations. More examples are described in US patent application US2016-0161863 and published US patent application US 2016/0370717A1 incorporated herein by reference in its entirety.

FIG. 5(*a*) presents an embodiment of a metrology apparatus and, more specifically, a dark field scatterometer. A target T and diffracted rays of measurement radiation used to illuminate the target are illustrated in more detail in FIG. 5(*b*). The metrology apparatus illustrated is of a type known as a dark field metrology apparatus. The metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, light emitted by source 11 (e.g., a xenon lamp) is directed onto substrate W via a beam splitter 15 by an optical system comprising lenses 12, 14 and objective lens 16. These lenses are arranged in a double sequence of a 4F arrangement. A different lens arrangement can be used, provided that it still provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary light outside the desired illumination mode will interfere with the desired measurement signals.

As shown in FIG. 5(*b*), target T is placed with substrate W normal to the optical axis O of objective lens 16. The substrate W may be supported by a support (not shown). A ray of measurement radiation I impinging on target T from an angle off the axis O gives rise to a zeroth order ray (solid line 0) and two first order rays (dot-chain line +1 and double dot-chain line −1). It should be remembered that with an overfilled small target, these rays are just one of many parallel rays covering the area of the substrate including metrology target T and other features. Since the aperture in plate 13 has a finite width (necessary to admit a useful quantity of light, the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the grating pitches of the targets and the illumination angles can be designed or adjusted so that the first order rays entering the objective lens are closely aligned with the central optical axis. The rays illustrated in FIGS. 5(*a*) and 3(*b*) are shown somewhat off axis, purely to enable them to be more easily distinguished in the diagram.

At least the 0 and +1 orders diffracted by the target T on substrate W are collected by objective lens 16 and directed back through beam splitter 15. Returning to FIG. 5(*a*), both the first and second illumination modes are illustrated, by designating diametrically opposite apertures labeled as north (N) and south (S). When the incident ray I of measurement radiation is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled 1(S)) are the ones which enter the lens 16.

A second beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for many measurement purposes such as reconstruction.

In the second measurement branch, optical system 20, 22 forms an image of the target T on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to processor PU which processes the image, the function of which will depend on the particular type of measurements being performed. Note that the term 'image' is used here in a broad sense. An image of the grating lines as such will not be formed, if only one of the −1 and +1 orders is present.

The particular forms of aperture plate 13 and field stop 21 shown in FIG. 5 are purely examples. In another embodiment of the invention, on-axis illumination of the targets is used and an aperture stop with an off-axis aperture is used to pass substantially only one first order of diffracted light to the sensor. In yet other embodiments, 2nd, 3rd and higher order beams (not shown in FIG. 5) can be used in measurements, instead of or in addition to the first order beams.

In order to make the measurement radiation adaptable to these different types of measurement, the aperture plate 13 may comprise a number of aperture patterns formed around a disc, which rotates to bring a desired pattern into place. Note that aperture plate 13N or 13S can only be used to measure gratings oriented in one direction (X or Y depending on the set-up). For measurement of an orthogonal grating, rotation of the target through 90° and 270° might be implemented. Different aperture plates are shown in FIGS. 5(*c*) and (*d*). The use of these, and numerous other variations and applications of the apparatus are described in prior published applications, mentioned above.

Figures 5A, 5B, 5C, 5D, 6, 7:
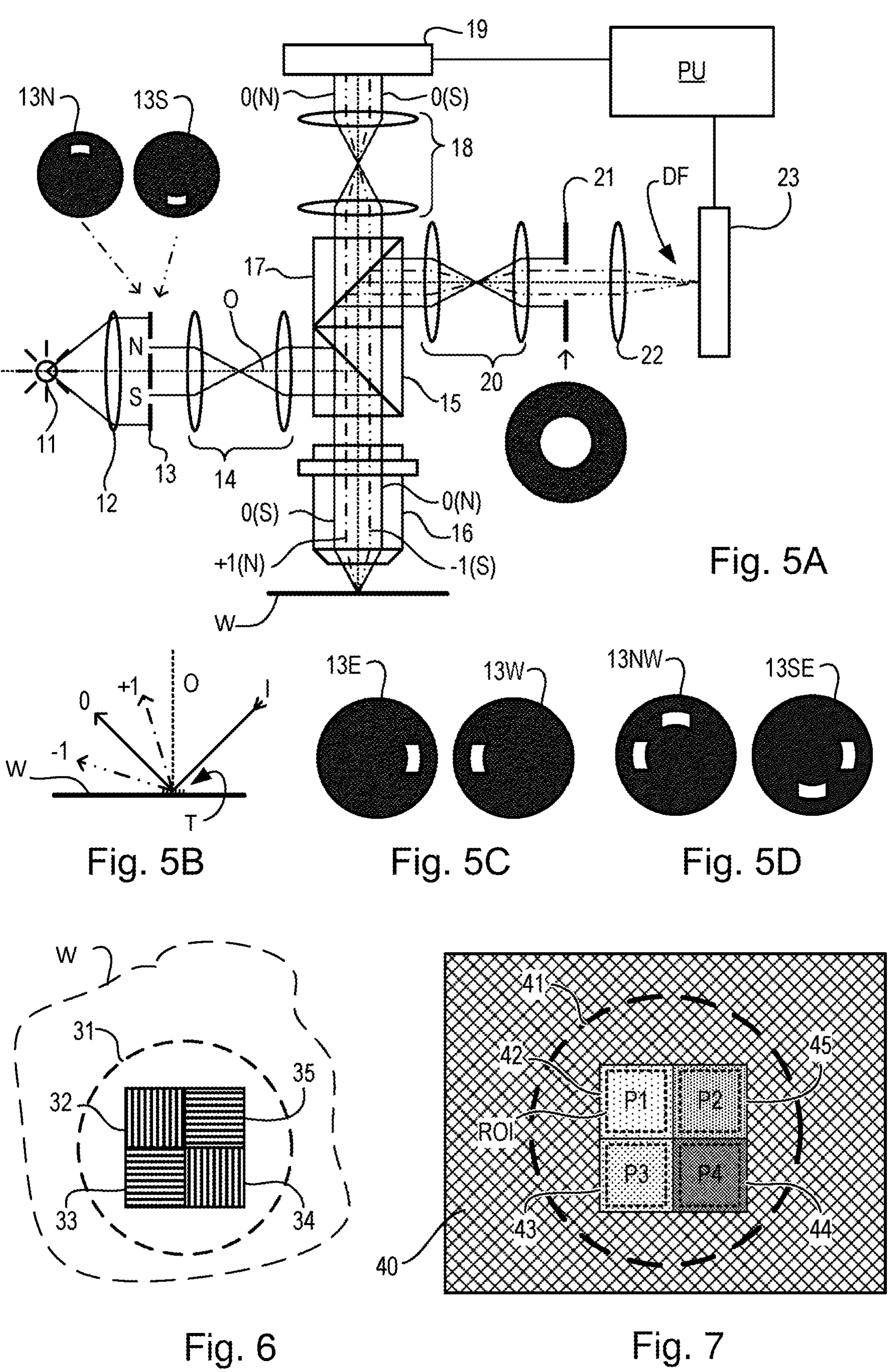
FIG. 5A depicts a schematic diagram of a dark field scatterometer for use in measuring targets according to embodiments of the invention using a first pair of illumination apertures.
FIG. 5B depicts a detail of diffraction spectrum of a target grating for a given direction of illumination.
FIG. 5C depicts a second pair of illumination apertures providing further illumination modes in using the scatterometer for diffraction based overlay measurements.
FIG. 5D depicts a third pair of illumination apertures combining the first and second pair of apertures.
FIG. 6 depicts a known form of multiple grating target and an outline of a measurement spot on a substrate.
FIG. 7 depicts an image of the target of FIG. 6 obtained in the scatterometer of FIG. 5A.

FIG. 6 depicts an overlay target or composite overlay target formed on a substrate according to known practice. The overlay target in this example comprises four sub-targets (e.g., gratings) 32 to 35 positioned closely together so that they will all be within a measurement spot 31 formed by the metrology radiation illumination beam of the metrology apparatus. The four sub-overlay targets thus are all simultaneously illuminated and simultaneously imaged on sensor 23. In an example dedicated to measurement of overlay, sub-targets 32 to 35 are themselves composite structures formed by overlying gratings that are patterned in different layers of the semi-conductor device formed on substrate W. Sub-targets 32 to 35 may have differently biased overlay offsets in order to facilitate measurement of overlay between the layers in which the different parts of the composite sub-targets are formed. The meaning of overlay bias will be explained below with reference to FIG. 7. Sub-targets 32 to 35 may also differ in their orientation, as shown, so as to diffract incoming radiation in X and Y directions. In one example, sub-targets 32 and 34 are X-direction sub-targets with biases of the +d, −d, respectively. Sub-targets 33 and 35 are Y-direction sub-targets with offsets +d and −d respectively. Separate images of these sub-targets can be identified in the image captured by sensor 23. This is only one example of an overlay target. An overlay target may comprise more or fewer than 4 sub-targets.

FIG. 7 shows an example of an image that may be formed on and detected by the sensor 23, using the overlay target of FIG. 6 in the apparatus of FIG. 5(*a*), using the aperture plates 13NW or 13SE from FIG. 5(*d*). While the pupil plane image sensor 19 cannot resolve the different individual sub-targets 32 to 35, the image sensor 23 can do so. The hatched area 40 represents the field of the image on the sensor, within which the illuminated spot 31 on the substrate is imaged into a corresponding circular area 41. Within this, rectangular areas 42-45 represent the images of the small overlay target sub-targets 32 to 35. If the overlay targets are located in product areas, product features may also be visible in the periphery of this image field. Image processor and controller PU processes these images using pattern recognition to identify the separate images 42 to 45 of sub-targets 32 to 35. In this way, the images do not have to be aligned very precisely at a specific location within the sensor frame, which greatly improves throughput of the measuring apparatus as a whole.

Once the separate images of the overlay targets have been identified, the intensities of those individual images can be measured, e.g., by averaging or summing selected pixel intensity values within the identified areas. Intensities and/or other properties of the images can be compared with one another. These results can be combined to measure different parameters of the lithographic process. Overlay performance is an important example of such a parameter.

Figure 8:
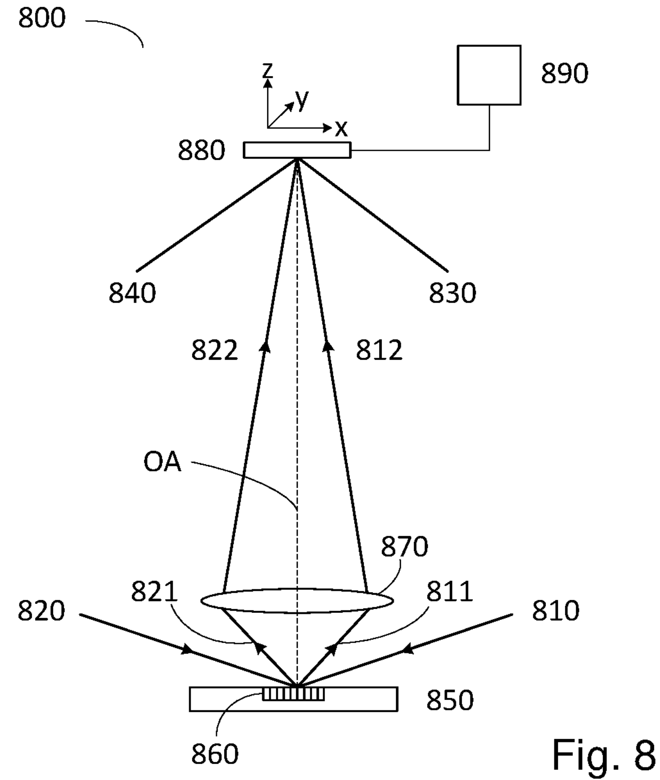
FIG. 8 depicts schematically a dark field digital holographic microscope (df-DHM) operated in a parallel acquisition scheme, in accordance with an embodiment.

FIG. 8 schematically illustrates the imaging branch of a dark field digital holographic microscope (df-DHM) 800 in accordance with an embodiment. A dark field digital holographic microscope (df-DHM) comprises an imaging branch and an illumination branch. In this embodiment, a metrology target 860 comprising a structure on a substrate 850 is illuminated by two illumination beams of radiation, i.e., a first illumination beam of radiation 810 and a second illumination beam of radiation 820. In an embodiment, such two illumination beams 810, 820 may simultaneously illuminate the metrology target 860.

In an embodiment, the first illumination beam 810 may be incident on the metrology target 860 at a first angle of incidence in a first direction with respect to the optical axis OA. The second illumination beam 820 may be incident on the metrology target 860 at a second angle of incidence in a second direction with respect to the optical axis OA. The first angle of incidence of the first illumination beam 810 and the second angle of incidence of the second illumination beam 820 may be substantially the same. The angle of incidence of each illumination beam may be, for example in the range of 70 degrees to 90 degrees, in the range of 50 degrees to 90 degrees, in the range of 30 degrees to 90 degrees, in the range of 10 degrees to 90 degrees. The illumination of the metrology target 860 may result in radiation being scattered from the target. In an embodiment, the first illumination beam 810 may be incident on the metrology target 860 at a first azimuthal angle, corresponding to the first direction. The second illumination beam 820 may be incident on the metrology target 860 at a second azimuthal angle, corresponding to the second direction. The first azimuthal angle of the first illumination beam 810 and the second azimuthal angle of the second illumination beam 820 may be different; e.g., opposing angles 180 degrees apart.

Depending on the structure of the metrology target 860, the scattered radiation may comprise reflected radiation, diffracted radiation or transmitted radiation. In this embodiment, the metrology target may be a diffraction-based overlay target; and each illumination beam may correspond to a scattered beam comprising at least one non-zeroth diffraction order. Each scattered beam carries information of the illuminated metrology target. For example, the first illumination beam 810 may correspond to the first scattered beam 811 comprising the positive first diffraction order +1st DF; the second illumination beam 820 may correspond to the second scattered beam 821 comprising the negative first diffraction order −1st DF. The zeroth diffraction order and other undesired diffraction orders may either be blocked by a beam blocking element (not shown) or configured to completely fall outside the NA of the objective lens 870. As a result, the df-DHM may be operated in a dark field mode.

Note that, in some embodiments, one or more optical elements, e.g., a lens combination, may be used to achieve same optical effect of the objective lens 870.

Both scattered beams 811, 821 may be collected by objective lens 870 and subsequently re-focused onto an image sensor 880. Objective lens 870 may comprise multiple lenses, and/or df-DHM 800 may comprise a lens system having two or more lenses, e.g., an objective lens and an imaging lens similar to the exemplary df-DHG of FIG. 9, thereby defining a pupil plane of the objective lens between the two lenses and an image plane at the focus of the imaging lens. In this embodiment, a portion 812 of the first scattered beam 811 and a portion 822 of the second scattered beam 821 are simultaneously incident at a common position of the image sensor 880. At the same time, two reference beams of radiation, i.e. a first reference beam 830 and a second reference beam 840, are incident on the same position of the image sensor 880. Such four beams may be grouped into two pairs of scattered radiation and reference radiation. For example, the first scattered-reference beam pair may comprise the portion 812 of the first scattered beam 811 and the first reference beam 830. Likewise, the portion 822 of the second scattered-reference beam pair may comprise the second scattered beam 821 and the second reference beam 840. These two scattered-reference beam pairs may subsequently form two interference patterns (holographic images) which at least partially overlap in spatial domain.

In an embodiment, in order to separate the two at least partially, spatially overlapping interference patterns (e.g., in the spatial frequency domain), the first reference beam 830 may have a first angle of incidence with respect to the optical axis OA and the second reference beam 840 may have a second angle of incidence with respect to the optical axis OA; the first angle of incidence and the second angle of incidence being different. Alternatively or in addition, the first reference beam 830 may have a first azimuthal angle with respect to the optical axis OA and the second reference beam 840 may have a second azimuthal angle with respect to the optical axis OA; the first and second azimuthal angles being different.

One known metrology method which may be performed using a metrology tool such as illustrated in FIG. 5(*a*) or FIG. 8 is known as diffraction based overlay (DBO) or micro-diffraction based overlay (μDBO). Such μDBO techniques use the imaging branch (the branch through detector 23) of the metrology tool, and determine asymmetry in a structure based on an intensity or diffraction efficiency asymmetry or intensity or diffraction efficiency difference between a first diffraction order and a second diffraction order of a pair of complementary pair of diffraction orders (typically a complementary pair of first diffraction orders, i.e., the first diffraction order may comprise the +1 order and the second diffraction order may comprise the −1 order as illustrated in FIG. 5(*b*)). As such, in this context, the terms "first" and "second" do not refer to a diffraction order number and are simply being used to distinguish the two diffractions orders of a complementary pair, noting that the first and second diffraction orders may be the +2 and −2 diffraction orders or a higher pair of complementary diffraction orders. The zeroth order (specular radiation) is typically blocked or diverted elsewhere (e.g., to another part of the detector for monitoring purposes); it is not used in μDBO metrology. The main "images" used for parameter of interest inference are formed only from higher (e.g., first) diffraction orders. The asymmetry of the structure may be used to infer a parameter of interest such as overlay or focus, depending on the target design.

Overlay is only one parameter of interest measurable using such techniques. Another parameter of interest may be exposure focus. This exposure focus may be measured using diffraction based focus (DBF) or micro-diffraction based focus (μDBF) metrology. The measurement principle for μDBO and μDBF is essentially the same (measurement of target asymmetry via intensity asymmetry in complementary diffraction orders). The main difference in the two techniques is in the targets: μDBO targets have an overlay dependent asymmetry and μDBF targets have an exposure focus based asymmetry. Similarly, other target types and metrology techniques may be used such as continuous diffraction based overlay (cDBO) targets, and corresponding cDBO measurement techniques. More generally, the basic concept is applicable to any metrology application where spatially resolved images are acquired.

In the absence of any target imperfection (asymmetry in one or both of the gratings which make up the composite target), an overlay target would need only one pad or sub-target (the two terms are used synonymously) per measurement direction, conventionally referred to as an X pad for measuring a parameter of interest such as overlay in the X direction and a Y pad for measuring a parameter of interest such as overlay in the Y direction where X and Y are the two perpendicular directions in the substrate plane. However, targets tend to have asymmetrical imperfections, and these are typically addressed by providing two pads per direction in each target so as to correct for an offset resulting from the unwanted asymmetry.

An example of such a target has already been described above and illustrated in FIG. 6, where each pair of pads per direction has a deliberate bias, respectively +d and −d. It should be appreciated that imposing biases of equal magnitude and opposite direction is convenient, but not necessary. All that is relevant for such μDBO metrology is that the two pads have a bias difference (e.g., one pad might be unbiased).

Specifically, overlay OV may be calculated as:

$$OV = d\frac{\Delta I_{+d} + \Delta I_{-d}}{\Delta I_{+d} - \Delta I_{-d}}$$

where d is the target bias magnitude and $\Delta I_{+d}$ and $\Delta I_{-d}$ are the difference in measured diffraction efficiency or intensity between the positive and negative diffraction orders of the pads with positive and negative bias respectively. Diffraction efficiency and intensity are related measurement parameters and may be used interchangeably.

The intensity or diffraction efficiency is measured from the captured μDBO camera images (such as illustrated in FIG. 7) by finding the target position and integrating a certain region of interest (ROI) within the camera images. These regions are typically rectangular (for convenience) and may be integrated according to a binary template; this is computationally highly efficient, but does not account for known optical aberrations or nuisance structures.

Overlay and other parameter of interest measurements using such methods as described are highly vulnerable to crosstalk between different pads and/or between a pad and neighboring nuisance structures (e.g., product structures). This is a problem with both the scatterometer tool such as illustrated in FIG. 5(*a*), which typically uses partially coherent measurement radiation, and a digital holographic microscope tool (such as illustrated in FIG. 8), which typically uses coherent measurement radiation. In the latter case, the coherent radiation is known to give rise to coherent imaging artefacts ('ringing') which further increases the potential for crosstalk.

In either case, calculating diffraction efficiency or intensity by straightforward rectangular window integration means measurements will be subject to large errors or fail outright when nuisance structures are nearby, which may appear bright in the captured image (i.e., high diffraction efficiency).

Figure 9:
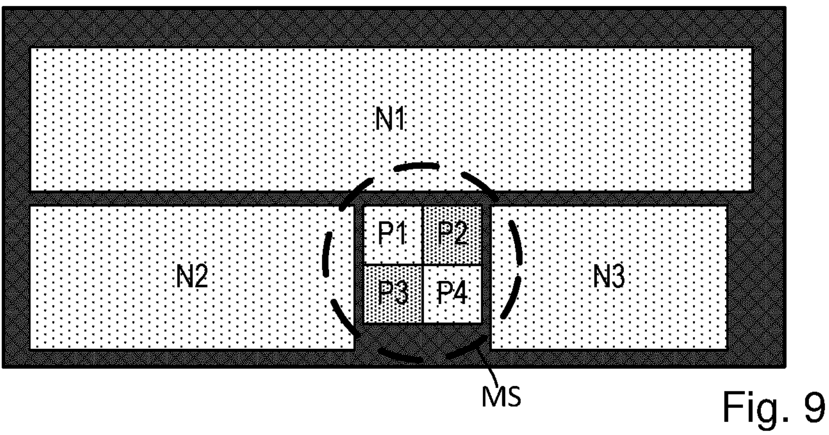
FIG. 9 comprises an image representation of a target and surrounding nuisance structure.

FIG. 9 shows an image including a target, such as a typical μDBO target, comprising four pads (or sub-targets) P1, P2, P3, P4 surrounded by areas of nuisance structure N1, N2, N3. As can be seen, parts of this nuisance structure are captured within measurement spot MS. By way of a specific example measurement of intensity or diffraction efficiency for a single pad, e.g., P1 may be subject to cross talk from the other pads P2, P3, P4 and the nuisance structures, in particular nuisance structures N1, N2.

Most crosstalk issues can be circumvented by broadening the exclusion zone around targets, to ensure that there are no structures in view (captured within the measurement spot) with which crosstalk could occur. However, this does not address the issue of crosstalk from other pads of the target, and is in any case undesirable because of the increased metrology footprint.

It is therefore proposed to retrieve diffraction efficiency or other measurement parameter by determining an overlap between the captured image and a calculated or calibrated reference image, the reference image having been orthonormalized to the expected sources of crosstalk. Theoretically, this can correct for all crosstalk, although there may be practical limitations which might limit its effectiveness. However, even where correction for all crosstalk is not practically possible, the proposed methods will provide significant improvement and crosstalk suppression.

Therefore, disclosed herein is a method of determining an orthonormalized structure of interest reference image for applying to a measured image of the structure of interest to correct for the effect of crosstalk from at least one nuisance structure. The method comprises determining a structure of interest reference image based on knowledge of the structure of interest; determining at least one nuisance structure reference image based on knowledge of the at least one nuisance structure; and orthonormalizing the structure of interest reference image to the at least one nuisance reference image to obtain the orthonormalized structure of interest reference image.

Also disclosed is a method of determining a measurement parameter relating to a structure of interest. The method comprises obtaining an orthonormalized structure of interest reference image relating to said structure of interest, the orthonormalized structure of interest reference image having been orthonormalized with respect to at least one nuisance structure reference image relating to at least one nuisance structure; obtaining at least one measured image comprising an image of the structure of interest which is impacted by the nuisance structure; and determining the measurement parameter from a combination of each said at least one measured image and the orthonormalized structure of interest reference image such that the determined measurement parameter is corrected for the impact of the nuisance structure.

Figure 10:
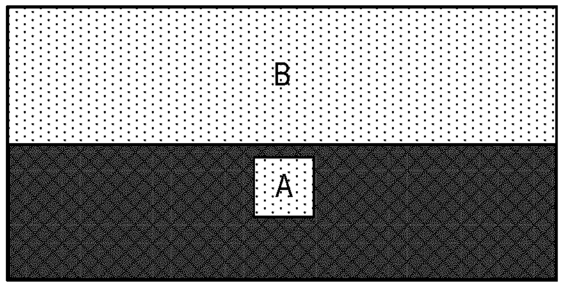
FIG. 10 comprises an image representation of a target pad and single nuisance structure.

FIG. 10 illustrates an image which comprises one overlay pad A and a nuisance B. This exemplary arrangement will be used to describe the proposed concept. This example will be specifically relevant to the incoherent imaging regime; applicability of the concepts to other regimes of coherence will described later. The image I of pad (structure of interest) A and nuisance structure B can be written as:

$$I = \alpha A + \beta B$$

where A and B represent the (e.g., normalized) intensity images that would be obtained respectively for the pad in isolation and the nuisance in isolation. Either of these intensity images A, B can calculated and/or calibrated for as reference images; e.g., a structure of interest reference image A and a nuisance reference image B. The prefactors α and β correspond to the diffraction efficiencies (or other measurement parameter) of the two pads.

More specifically, the structure of interest reference image A may be simulated/estimated based on knowledge of the structure of interest parameters and knowledge of the imaging optics. This can be achieved, for example, by applying the known (4D) point spread function(s) of the imaging optics to the target/structure design. In a similar manner, nuisance reference image B of the suspected crosstalk/nuisance structure may be determined.

The aim of the methods disclosed is to determine structure of interest prefactor or sub-target prefactor α from the measured image I, without dependence on nuisance prefactor β. In doing this, it becomes possible to infer the parameter of interest without errors from crosstalk.

After ROI selection, one known approach is to integrate a rectangular window to find a single diffraction efficiency or intensity value within the ROI. A slightly more advanced technique may comprise calculating an overlap between the reference image A and the measured target image I. This yields:

$$A \cdot I = \alpha + \beta\,(A \cdot B) = \alpha + \beta x$$

where x=A·B is the crosstalk term. A and B may be normalized for brevity. The impact of the crosstalk term x=A·B is to make the diffraction efficiency sensitive to nuisance diffraction efficiency.

To address this, it is proposed to calculate/determine a structure of interest reference image A and a nuisance reference image B, and then to orthonormalize the structure of interest reference image A to the nuisance reference image B to obtain an orthonormalized structure of interest reference image A'. This can then be overlapped, i.e., combined with the measurement image to find the corrected diffraction efficiency, intensity or other measurement parameter a (i.e., the measurement parameter in the absence of crosstalk). The orthonormalization may use a variant of the Gram-Schmidt process, for example.

Orthonormalized structure of interest reference image A' may be determined as:

$$A' = \frac{1}{1 - x^2}(A - xB) \text{ where } x = A \cdot B$$

Calculating the overlap between the measured image and this orthonormalized reference image (e.g., by taking their dot product) yields:

$$A' \cdot I = \frac{1}{1 - x^2}\left(\alpha + \beta x - \alpha x^2 - \beta x\right) = \alpha$$

As such, it is possible to determine the measurement parameter or diffraction efficiency α, without dependence on β and therefore without crosstalk. In effect, knowledge of the shape and position of the nuisance has been used to construct an orthonormalized reference image that is immune to crosstalk from this type of nuisance.

The above derivation applies in the incoherent case, where intensities simply sum together, i.e., the imaging is linear between object function and the measured intensity. For partially coherent light, applying this technique may still leave some residual crosstalk. However, it is found in practice that incoherence is often a reasonable approximation of partially coherent systems and a significant reduction in crosstalk is still expected.

In a fully coherent case where phase information is available, such as in the DHM concept, the same technique applies without caveats: this is also a linear imaging regime, with a linear relation between the object function and the measured field from the sideband in the hologram. In this case, the equations may be appropriately expressed in amplitude space:

$$E = \alpha A + \beta B$$

with A and B complex amplitude images and α and β complex prefactors to account for the overall phases of template and nuisance. In this case, the prefactors α and β now represent the square root of pad diffraction efficiency (and therefore can be squared to obtain the wanted measurement parameter/diffraction efficiency) and the crosstalk term is now written as x=A·B*, where the asterisk denotes complex conjugation. The other equations are unchanged and very low sensitivity to crosstalk from the specified source can still be expected.

Applying this technique relies on knowing the shape and position of the nuisance. Conveniently, many nuisances are large rectangles at known distance from the pad being determined for (structure of interest). This means the technique is widely applicable to low-coherence systems. For the fully coherent, phase-resolved case, the full pre-aberration amplitude and phase distribution of the nuisance structure (which is related to the diffraction of the structure) should be determined or estimated. This may be found by calibration, where such structures are available, and therefore can be measured, in isolation. The pre-aberration amplitude and phase distribution can then be used in the determining of the nuisance structure reference image. As an alternative for known nuisances, the nuisance structure reference image can be determined using a model of the projection optics rather than a calibration. It should be noted that the measured field is assumed to be corrected by the field distribution of the known illumination spot. A suboptimal choice would reduce the effectiveness of the algorithm, but not eliminate its benefit.

More generally, while any small inaccuracies in determining the distance from structure of interest to nuisance will render the proposed technique less effective, an improvement in diffraction efficiency estimation can still be expected. Due to the limited length scale of crosstalk, only the portion of the nuisance close to the structure of interest matters, so limited information is likely to be sufficient.

Reference images may be orthonormalized preventively at little cost, other than that of the overlap calculation procedure.

The above derivation has been described in terms of a single nuisance; however a structure of interest may be orthonormalized to multiple nuisances including other pads of the same target for example, within theoretical and practical limits set by signal level.

In the general case of an arbitrary number of features (e.g., which may include a structure of interest and multiple nuisances), the image may be described as the sum of all contributions (where i is the number of contributions):

$$I = \sum_{i=1}^{n} e_i C_i$$

with (e.g., normalized) reference images $C=[C_1, C_2, \ldots, C_n]$ and prefactors $e=[e_1, e_2, \ldots, e_n]$. The reference images C can be simulated, estimated or measured in isolation as has already been described. As before, the prefactors represent the measurement parameters; e.g., diffraction efficiencies (in the case of intensity images) or square roots of diffraction efficiencies (in the case of electric field images). With reference to the single nuisance example given above $\alpha A$ is equivalent to $e_1C_1$ and $\beta B$ is equivalent to $e_2C_2$.

Taking the outer product of the vector C with its complex conjugate, a matrix $T=CC^*$ may be constructed, in which each matrix element represents the overlap between two reference images. The orthonormalized reference images $$C' = [C'_1, C'_2, \ldots, C'_n]$$

are found using the matrix inverse $T^{-1}$ of T as:

$$C' = T^{-1}C$$

Any individual prefactor $e_j$ (and therefore any corrected measurement parameter) can then be determined using the complex conjugate $C'_j{}^*$ of its corresponding orthonormalized reference image $C'_j$ as:

$$e_j = C'_j * \cdot I$$

It can be appreciated that no requirements on 4D aberration correction of the target image has been made. Unlike rectangular window integration (and most region of interest finding techniques), the templates may be aberrated with the full 4D aberration of the imaging objective. This is only expected to decrease performance in case of a drastic increase in crosstalk, e.g., due to disregarding of some relevant signal energy of the pads of interest by the proposed orthogonalization approach.

Imperfect nuisance reference images may result in errors in diffraction efficiency estimation proportional to the mismatch between the ideal and used reference image. However, as most nuisances are large, rectangular, and at a predictable distance from targets, this is unlikely to present a significant problem.

In situations with very large crosstalk, large overlap between the target and nuisance templates may lead to degraded performance. In this regime, the orthonormalized templates are very sensitive to the (small) differences between template and nuisance. This will only lead to good results at an extremely high signal to noise ratio. Of course, this scenario is challenging for all presently known techniques and the technique proposed here is still expected to outperform straightforward integration as is used presently.

Orthonormalized diffraction efficiency estimates in the orthonormalized case drastically outperform present integration and uncorrected correlation methods. In a representative example layout, for nuisances having an intensity 100 times greater than the pad of interest in the measured image, rectangular window integration produces a result that is more than 100% off. The proposed orthonormalized technique, by contrast, estimates diffraction efficiency correctly to within 0.01%. As such, the orthonormalized technique allows precise overlay measurement, whereas the state of the art technique fails completely.

While the above description is largely described in terms of measuring overlay targets and a parameter of interest of overlay, the proposed method is equally applicable for measurement of other structures such as focus targets or other metrology targets. The term "target" in this context should not necessarily imply targets formed specifically for metrology, and may also include other structures, including functional product structures, if used for measurement.

Figure 11:
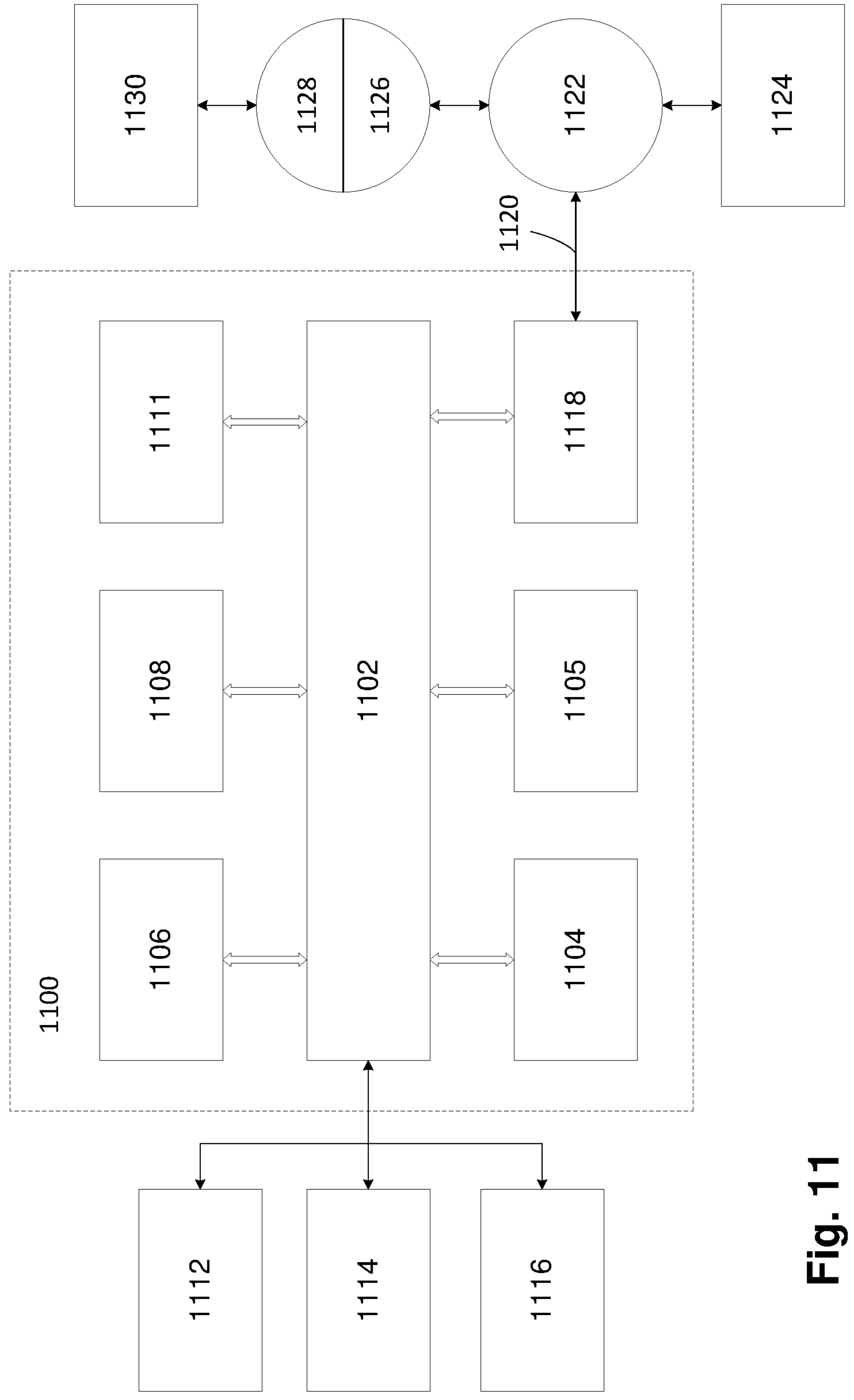
FIG. 11 depicts a block diagram of a computer system for controlling methods according to an embodiment.

FIG. 11 is a block diagram that illustrates a computer system 1100 that may assist in implementing the methods and flows disclosed and/or claimed herein. Computer system 1100 includes a bus 1102 or other communication mechanism for communicating information, and a processor 1104 (or multiple processors 1104 and 1105) coupled with bus 1102 for processing information. Computer system 1100 also includes a main memory 1106, such as a random access memory (RAM) or other dynamic storage device, coupled to bus 1102 for storing information and instructions to be executed by processor 1104. Main memory 1106 also may be used for storing temporary variables or other intermediate information during execution of instructions to be executed by processor 1104. Computer system 1100 further includes a read only memory (ROM) 1108 or other static storage device coupled to bus 1102 for storing static information and instructions for processor 1104. A storage device 1110, such as a magnetic disk or optical disk, is provided and coupled to bus 1102 for storing information and instructions.

Computer system 1100 may be coupled via bus 1102 to a display 1112, such as a cathode ray tube (CRT) or flat panel or touch panel display for displaying information to a computer user. An input device 1114, including alphanumeric and other keys, is coupled to bus 1102 for communicating information and command selections to processor 1104. Another type of user input device is cursor control 1116, such as a mouse, a trackball, or cursor direction keys for communicating direction information and command selections to processor 1104 and for controlling cursor movement on display 1112. This input device typically has two degrees of freedom in two axes, a first axis (e.g., x) and a second axis (e.g., y), that allows the device to specify positions in a plane. A touch panel (screen) display may also be used as an input device.

One or more of the methods as described herein may be performed by computer system 1100 in response to processor 1104 executing one or more sequences of one or more instructions contained in main memory 1106. Such instructions may be read into main memory 1106 from another computer-readable medium, such as storage device 1110. Execution of the sequences of instructions contained in main memory 1106 causes processor 1104 to perform the process steps described herein. One or more processors in a multi-processing arrangement may also be employed to execute the sequences of instructions contained in main memory 1106. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 1104 for execution. Such a medium may take many forms, including but not limited to, non-volatile media, volatile media, and transmission media. Non-volatile media include, for example, optical or magnetic disks, such as storage device 1110. Volatile media include dynamic memory, such as main memory 1106. Transmission media include coaxial cables, copper wire and fiber optics, including the wires that comprise bus 1102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 1104 for execution. For example, the instructions may initially be borne on a magnetic disk of a remote computer. The remote computer can load the instructions into its dynamic memory and send the instructions over a telephone line using a modem. A modem local to computer system 1100 can receive the data on the telephone line and use an infrared transmitter to convert the data to an infrared signal. An infrared detector coupled to bus 1102 can receive the data carried in the infrared signal and place the data on bus 1102. Bus 1102 carries the data to main memory 1106, from which processor 1104 retrieves and executes the instructions. The instructions received by main memory 1106 may optionally be stored on storage device 1110 either before or after execution by processor 1104.

Computer system 1100 also preferably includes a communication interface 1118 coupled to bus 1102. Communication interface 1118 provides a two-way data communication coupling to a network link 1120 that is connected to a local network 1122. For example, communication interface 1118 may be an integrated services digital network (ISDN) card or a modem to provide a data communication connection to a corresponding type of telephone line. As another example, communication interface 1118 may be a local area network (LAN) card to provide a data communication connection to a compatible LAN. Wireless links may also be implemented. In any such implementation, communication interface 1118 sends and receives electrical, electromagnetic or optical signals that carry digital data streams representing various types of information.

Network link 1120 typically provides data communication through one or more networks to other data devices. For example, network link 1120 may provide a connection through local network 1122 to a host computer 1124 or to data equipment operated by an Internet Service Provider (ISP) 1126. ISP 1126 in turn provides data communication services through the worldwide packet data communication network, now commonly referred to as the "Internet" 1128. Local network 1122 and Internet 1128 both use electrical, electromagnetic or optical signals that carry digital data streams. The signals through the various networks and the signals on network link 1120 and through communication interface 1118, which carry the digital data to and from computer system 1100, are exemplary forms of carrier waves transporting the information.

Computer system 1100 may send messages and receive data, including program code, through the network(s), network link 1120, and communication interface 1118. In the Internet example, a server 1130 might transmit a requested code for an application program through Internet 1128, ISP 1126, local network 1122 and communication interface 1118. One such downloaded application may provide for one or more of the techniques described herein, for example. The received code may be executed by processor 1104 as it is received, and/or stored in storage device 1110, or other non-volatile storage for later execution. In this manner, computer system 1100 may obtain application code in the form of a carrier wave.

Further embodiments are disclosed in the subsequent list of numbered clauses:

1. A method of determining an orthonormalized structure of interest reference image, the orthonormalized structure of interest reference image for applying to a measured image of the structure of interest to correct for the effect of crosstalk from at least one nuisance structure; the method comprising:
   - determining a structure of interest reference image based on knowledge of the structure of interest;
   - determining at least one nuisance structure reference image based on knowledge of the at least one nuisance structure; and
   - orthonormalizing the structure of interest reference image to the at least one nuisance reference image to obtain the orthonormalized structure of interest reference image.
2. A method as defined in clause 1, wherein said steps of determining a structure of interest reference image and determining at least one nuisance structure reference image are both based on knowledge of the imaging optics used to obtain the measured image.
3. A method as defined in clause 2, wherein one or both of said steps of determining a structure of interest reference image and said determining at least one nuisance structure reference image comprise applying one or more known point spread functions of the imaging optics to said structure of interest and/or said at least one nuisance structure respectively.
4. A method as defined in any preceding clause, wherein one or both of said steps of determining a structure of interest reference image and said determining at least one nuisance structure reference image comprise measuring one or both of the structure of interest and/or said at least one nuisance structure in isolation.
5. A method as defined in any preceding clause, wherein the orthonormalizing step comprises determining the orthonormalized structure of interest reference image from a product of an inverse matrix and a vector comprising the structure of interest reference image and each at least one nuisance structure reference image, the inverse matrix comprising an outer product of said vector with its complex conjugate.
6. A method as defined in any preceding clause, comprising:

obtaining a measured image comprising an image of the structure of interest;

determining an overlap between the measured image and the orthonormalized structure of interest reference image; and determining a measurement parameter for the structure of interest from said overlap.

7. A method as defined in clause 6, wherein said determining an overlap comprises determining the dot product of the measured image and the orthonormalized structure of interest reference image.

8. A method as defined in clause 6 or 7, wherein the measurement parameter comprises amplitude, intensity or diffraction efficiency.

9. A method as defined in clause 6, 7 or 8, comprising determining a parameter of interest from said measurement parameter.

10. A method as defined in clause 9, wherein the parameter of interest is overlay or focus.

11. A method as defined in any preceding clause, wherein measurement radiation used to capture said measured image is substantially coherent.

12. A method as defined in clause 11, comprising:

determining or estimating a pre-aberration amplitude and phase distribution of the at least one nuisance structure; and using the pre-aberration amplitude and phase distribution in said step of determining at least one nuisance structure reference image.

13. A method as defined in any of clauses 1 to 10, wherein measurement radiation used to capture said measured image is incoherent or partially coherent.

14. A method as defined in any preceding clause, wherein said structure of interest is a metrology target or sub-target thereof.

15. A method as defined in any preceding clause, wherein said at least one nuisance structure comprises product structure and/or a sub-target other than the structure of interest.

16. A method of determining a measurement parameter relating to a structure of interest, the method comprising:

obtaining an orthonormalized structure of interest reference image relating to said structure of interest, the orthonormalized structure of interest reference image having been orthonormalized with respect to at least one nuisance structure reference image relating to at least one nuisance structure;

obtaining at least one measured image comprising an image of the structure of interest which is impacted by the nuisance structure;

determining the measurement parameter from a combination of each said at least one measured image and the orthonormalized structure of interest reference image such that the determined measurement parameter is corrected for the impact of the nuisance structure.

17. A method as defined in clause 16, comprising performing the method of any of clauses 1 to 5 to determine the orthonormalized structure of interest reference image.

18. A method as defined in clause 16 or 17, wherein said combination comprises the dot product of each said at least one measured image with the orthonormalized structure of interest reference image.

19. A method as defined in any of clauses 16 to 18, wherein the measurement parameter comprises amplitude, intensity or diffraction efficiency.

20. A method as defined in any of clauses 16 to 19, comprising determining a parameter of interest from said measurement parameter.

21. A method as defined in clause 20, wherein the parameter of interest is overlay or focus.

22. A computer program comprising program instructions operable to perform the method of any preceding clause, when run on a suitable apparatus.

23. A non-transient computer program carrier comprising the computer program of clause 22.

24. A processing arrangement comprising:

a computer program carrier comprising the computer program of clause 23; and a processor operable to run said computer program.

25. A metrology device comprising the processing arrangement of clause 24.

26. A metrology device as defined in clause 25, comprising:

imaging optics for capturing scattered radiation from a structure of interest; and a detector for detecting the scattered radiation to obtain a measured image of the structure of interest.

27. The metrology device of clause 25 or 26, being a scatterometer.

28. The metrology device of clause 25 or 26, being a dark-field holographic microscope.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of an inspection or metrology apparatus, embodiments of the invention may be used in other apparatus. Embodiments of the invention may form part of a mask inspection apparatus, a lithographic apparatus, or any apparatus that measures or processes an object such as a wafer (or other substrate) or mask (or other patterning device). The term "metrology apparatus" may also refer to an inspection apparatus or an inspection system. E.g. the inspection apparatus that comprises an embodiment of the invention may be used to detect defects of a substrate or defects of structures on a substrate. In such an embodiment, a characteristic of interest of the structure on the substrate may relate to defects in the structure, the absence of a specific part of the structure, or the presence of an unwanted structure on the substrate.

Although specific reference is made to "metrology apparatus/tool/system" or "inspection apparatus/tool/system", these terms may refer to the same or similar types of tools, apparatuses or systems. E.g. the inspection or metrology apparatus that comprises an embodiment of the invention may be used to determine characteristics of structures on a substrate or on a wafer. E.g. the inspection apparatus or metrology apparatus that comprises an embodiment of the invention may be used to detect defects of a substrate or defects of structures on a substrate or on a wafer. In such an embodiment, a characteristic of interest of the structure on the substrate may relate to defects in the structure, the absence of a specific part of the structure, or the presence of an unwanted structure on the substrate or on the wafer.

Although specific reference may have been made above to the use of embodiments of the invention in the context of optical lithography, it will be appreciated that the invention, where the context allows, is not limited to optical lithography and may be used in other applications, for example imprint lithography.

While the targets or target structures (more generally structures on a substrate) described above are metrology target structures specifically designed and formed for the purposes of measurement, in other embodiments, properties of interest may be measured on one or more structures which are functional parts of devices formed on the substrate. Many devices have regular, grating-like structures. The terms structure, target grating and target structure as used herein do not require that the structure has been provided specifically for the measurement being performed. Further, pitch P of the metrology targets may be close to the resolution limit of the optical system of the scatterometer or may be smaller, but may be much larger than the dimension of typical product features made by lithographic process in the target portions C. In practice the lines and/or spaces of the overlay gratings within the target structures may be made to include smaller structures similar in dimension to the product features.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A method of determining an orthonormalized structure of interest reference image, the orthonormalized structure of interest reference image configured to be applied to a measured image of the orthonormalized structure of interest to correct for effect of crosstalk from at least one nuisance structure, the method comprising:

determining a structure of interest reference image based on knowledge of the structure of interest;

determining at least one nuisance structure reference image based on knowledge of the at least one nuisance structure; and orthonormalizing the structure of interest reference image to the at least one nuisance structure reference image to obtain the orthonormalized structure of interest reference image.

2. The method of claim 1, wherein the determining the structure of interest reference image and the determining the at least one nuisance structure reference image are both based on knowledge of imaging optics used to obtain the measured image.

3. The method of claim 2, wherein one or both of the determining the structure of the interest reference image and the determining the at least one nuisance structure reference image comprise applying one or more known point spread functions of the imaging optics to the structure of interest and/or the at least one nuisance structure respectively.

4. The method of claim 1, wherein one or both of the determining the structure of interest reference image and the determining the at least one nuisance structure reference image comprise measuring one or both of the structure of interest and/or the at least one nuisance structure in isolation.

5. The method of claim 1, wherein the orthonormalizing comprises determining the orthonormalized structure of interest reference image from a product of an inverse matrix and a vector comprising the structure of interest reference image and each at least one nuisance structure reference image, the inverse matrix comprising an outer product of the vector with its complex conjugate.

6. The method of claim 1, further comprising:

obtaining a measured image comprising an image of the structure of interest;

determining an overlap between the measured image and the orthonormalized structure of interest reference image; and determining a measurement parameter for the structure of interest from the overlap.

7. The method of claim 6, wherein the determining the overlap comprises determining a dot product of the measured image and the orthonormalized structure of interest reference image.

8. The method of claim 6, wherein the measurement parameter comprises amplitude, intensity, or diffraction efficiency.

9. The method of claim 6, further comprising:

determining a parameter of interest from the measurement parameter and/or the parameter of interest being overlay or focus.

10. The method of claim 1, further comprising:

using substantially coherent measurement radiation to capture the measured image.

11. The method of claim 10, further comprising:

determining or estimating a pre-aberration amplitude and phase distribution of the at least one nuisance structure; and using the pre-aberration amplitude and phase distribution in the determining the at least one nuisance structure reference image.

12. The method of claim 1, further comprising:

using incoherent or partially coherent measurement radiation to capture the measured image.

13. A computer program comprising program instructions operable to perform the method of claim 1, when run on a suitable apparatus.

14. A processing arrangement, comprising:

a computer program carrier comprising a computer program comprising program instructions operable to perform the method of claim 1; and a processor operable to run the computer program.

15. A metrology device, comprising:

imaging optics configured to capture scattered radiation from a structure of interest;

a detector configured to detect the scattered radiation to obtain a measured image of the structure of interest; and a processing arrangement comprising:

a computer program carrier comprising a computer program comprising program instructions operable to perform the method of claim 1; and a processor operable to run the computer program.

* * * * *